(12) United States Patent
Chen et al.

(10) Patent No.: US 9,606,172 B2
(45) Date of Patent: Mar. 28, 2017

(54) AGING DETECTION CIRCUIT AND METHOD THEREOF

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Shi-Hao Chen, Nantou County (TW); Yi-Ming Wang, New Taipei (TW); Ting-Hao Wang, Keelung (TW); Hung-Chun Li, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 214 days.

(21) Appl. No.: 14/525,231

(22) Filed: Oct. 28, 2014

(65) Prior Publication Data
US 2015/0301107 A1    Oct. 22, 2015

(30) Foreign Application Priority Data
Apr. 18, 2014   (TW) .............................. 103114276 A

(51) Int. Cl.
G01R 31/02    (2006.01)
G01R 31/28    (2006.01)
G01R 31/317   (2006.01)

(52) U.S. Cl.
CPC ... *G01R 31/2894* (2013.01); *G01R 31/31725* (2013.01)

(58) Field of Classification Search
CPC  G01R 1/0491; G01R 31/265; G01R 31/3012; G01R 31/318511; G01R 31/2642; G01R 31/2648; G01R 31/2831; G01R 31/31702
See application file for complete search history.

(56) References Cited

U.S. PATENT DOCUMENTS

| | | | |
|---|---|---|---|
| 8,299,825 B2 | 10/2012 | Noorlag et al. | |
| 2012/0161885 A1* | 6/2012 | Saneyoshi | G01R 31/2856 331/55 |
| 2013/0002274 A1 | 1/2013 | Saneyoshi et al. | |

(Continued)

FOREIGN PATENT DOCUMENTS

| | | |
|---|---|---|
| EP | 2241995 A1 | 10/2010 |
| TW | I251677 B | 3/2006 |
| TW | I426701 B | 2/2014 |

*Primary Examiner* — Tung X Nguyen
(74) *Attorney, Agent, or Firm* — CKC & Partners Co., Ltd.

(57) ABSTRACT

An aging detection circuit is provided. The aging detection circuit is configured on a chip and includes a testing circuit and an aging signal generation circuit. The testing circuit is electrically coupled to the aging signal generation circuit. The testing circuit generates an output signal. The aging signal generation circuit includes a signal generation circuit and a selection circuit. The signal generation circuit generates multiple input signals having different frequencies. The selection circuit selectively outputs one of the input signals as an aging signal to an input terminal of the testing circuit or feeds back the output signal generated by the testing circuit to the input terminal of the testing circuit.

9 Claims, 5 Drawing Sheets

(56) References Cited

U.S. PATENT DOCUMENTS

2013/0043914 A1 2/2013 Gelman
2014/0218060 A1* 8/2014 Saneyoshi .......... G01R 31/3187
                                                          324/750.3

* cited by examiner

AGING DETECTION CIRCUIT AND METHOD THEREOF

RELATED APPLICATIONS

This application claims priority to Taiwan Application Serial Number 103114276, filed Apr. 18, 2014 which is herein incorporated by reference.

BACKGROUND

Field of Invention

The present disclosure relates to an aging detection circuit. More particularly, the present disclosure relates to an aging detection circuit configured on a chip.

Description of Related Art

At recent years, replacement rate of electronic devices is gradually increasing in that hardware resource of the electronic devices is unable to catch up the massive computation required by the constantly updating software. Further, circuit aging of the electronic device may significantly deteriorate the operating speed of the electronic device.

Generally, various operating surrounding result in different aging extents of circuits of the electronic device, such as duration of operating time, operating voltage or operating temperature, which further changes characteristics of transistors in the circuits. For example, a threshold voltage of an aged transistor is different from that of a new transistor; particularly, the threshold voltage of the aging transistor is greater than the threshold voltage of the new transistor. In other words, in the circumstance of the same operating voltage, the aged circuit is more difficult to be conducted than that with the new transistors, and the current flowing through the aged circuit becomes smaller, which lowers the operating speed of the aged circuit and further makes the aged circuit improperly operate.

Traditionally, in order to overcome the aging problem of the transistor, the operating voltage level of the circuit is usually increased to make the circuit operate in a normal operating speed. The increase of the operating voltage level is usually dependent on an aging level of the circuit. A traditional method of detecting the aging level is usually detecting the threshold voltage of the transistor or the operating speed of the circuit such that the threshold voltage or the operating speed can be a reference for identifying the aging level of the circuit.

Techniques nowadays are however unable to effectively detect the aging level of the circuit itself if needed. To precisely detect an exact aging level of the circuit usually requires external hardware resource to assist in the detection, but the hardware resource costs too much and is impractical.

SUMMARY

The disclosure provides an aging detection circuit. The aging detection circuit is configured on a chip and includes a testing circuit and an aging signal generation circuit. The testing circuit is coupled to the aging signal generation circuit. The testing circuit generates the output signal. The aging signal generation circuit includes a signal generation circuit and a selection circuit. The signal generation circuit generates multiple input signals having different frequencies. The selection circuit selectively outputs one of the input signals as an aging signal to an input terminal of the testing circuit or feeds back an output signal of the testing circuit to the input terminal of the testing circuit.

The disclosure provides an aging detection method suitable for a testing circuit detecting an aging level of a surrounding circuit. The aging detection method includes the following steps: feeding back a first output signal generated by the testing circuit to the testing circuit from a first time point; generating multiple input signals having different frequencies and selectively outputting one of the input signals as an aging signal to an input terminal of the testing circuit from a second time point which is later than the first time point; feeding back a second output signal generated by the testing circuit to the testing circuit from a third time point which is later than the second time point, and comparing the first output signal and the second output signal.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
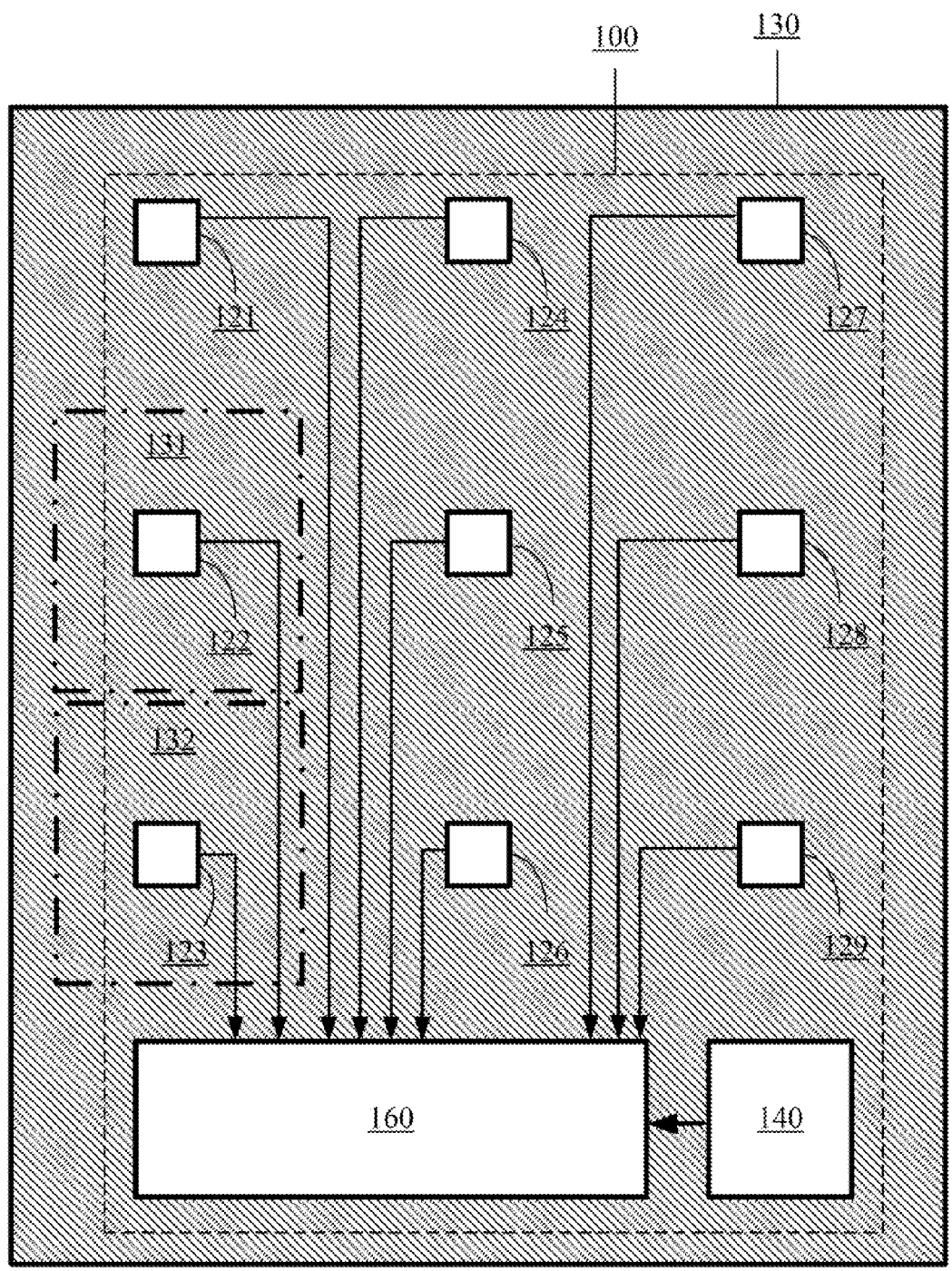
FIG. 1 is a schematic diagram illustrating an aging detection system according to one embodiment of this disclosure.

Reference will now be made in detail to the present embodiments of the disclosure, examples of which are illustrated in the accompanying drawings. Wherever possible, the same reference numbers are used in the drawings and the description to refer to the same or like parts.

Referring to FIG. 1, a schematic diagram illustrating an aging detection system according to one embodiment of this disclosure is presented. The aging detection system 100 is configured on a chip and includes nine aging detection circuits 121-129, memory 140 and chip monitoring circuit 160. As shown in the embodiment of FIG. 1 the aging detection circuits 121-129 are electrically coupled to the memory 140 and the chip monitoring circuit 160. The chip monitoring circuit 160 is electrically coupled to the memory 140. Internal circuit 130, which may includes processing unit, registers, active components, passive components, etc., is configured on the chip for executing at least one function such as driving a display, baseband signal processing in a wireless communication, etc. The aging detection circuits 121-129 may selectively detect performance of the internal circuit 130 or executing different modes of aging simulation.

In some embodiments, the number of the aging detection circuit is not restricted to 9.

In some embodiments, if a critical path of the internal circuit 130 is located in an internal circuit part 131, the corresponding aging detection circuit 122 is used to monitor the internal circuit part 131, in which a definition of the critical path is a circuit path corresponding to a tighter timing or has a special representativeness. On the other hand, if the critical path of the internal circuit 130 is through the internal circuit part 131 and the internal circuit part 132, the corresponding aging detection circuits 122 and 123 are used to monitor the internal circuit parts 131-132.

Figure 2:
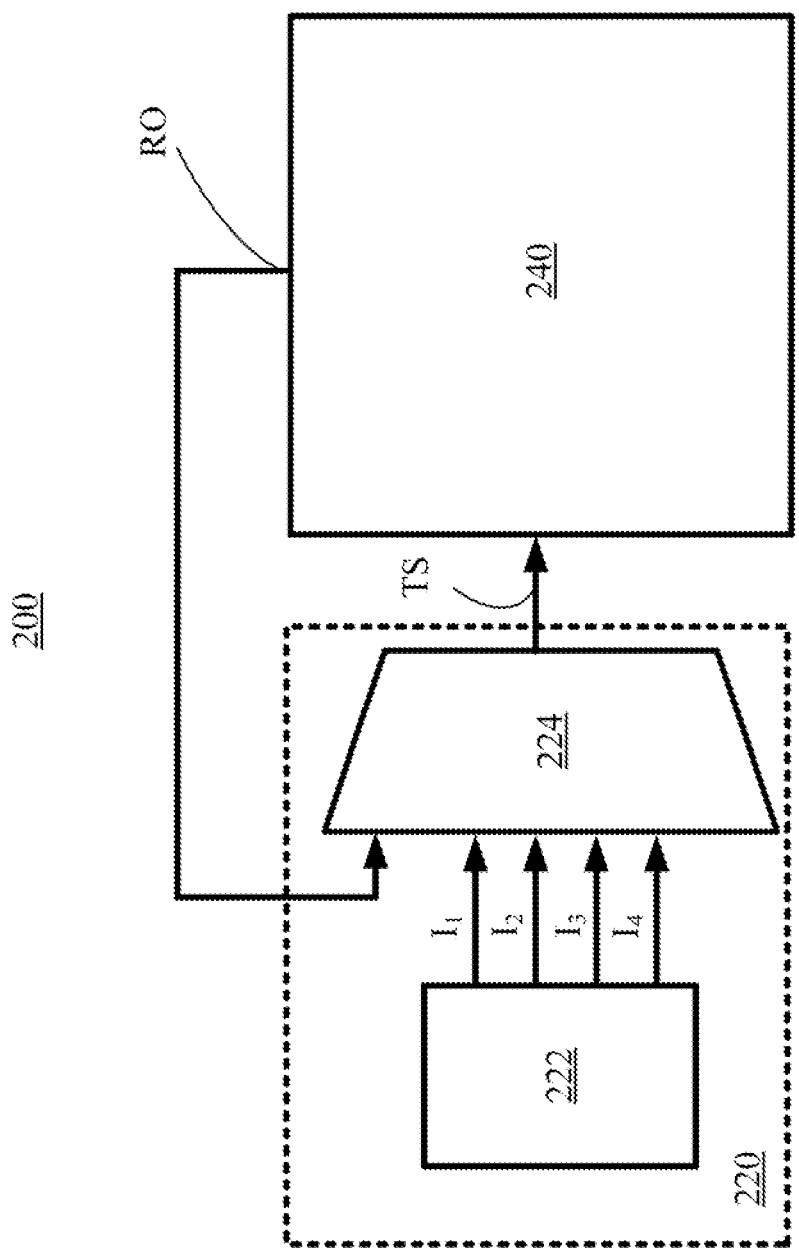
FIG. 2 is a functional block diagram illustrating an aging detection circuit according to one embodiment of this disclosure.

Referring also to FIG. 2 to illustrate functions of the aging detection circuits 121-129. FIG. 2 is a functional block diagram illustrating an aging detection circuit 200 according to one embodiment of this disclosure. Each of the aging detection circuit 121-129 in FIG. 1 has a structure as same as the one of the aging detection circuit 200.

As shown in FIG. 2, aging detection circuit 200 includes an aging signal generation circuit 220 and a testing circuit 240, in which the aging signal generation circuit 220 is electrically coupled to the testing circuit 240 and generates a testing signal TS to the testing circuit 240. An output terminal of the testing circuit 240 outputs an output signal RO and feeds back the output signal RO to the selection circuit 224.

The aging signal generation circuit 200 includes signal generation circuit 222 and selection circuit 224. The signal generation circuit 222 generates multiple input signals $I_1$-$I_4$ having different frequencies to the selection circuit 224. The selection circuit 224 selectively outputs one of the input signals $I_1$-$I_4$ or feeds back the output signal RO outputted by the testing circuit 240 to the testing circuit 240.

When the selection circuit 224 outputs one of the input signals $I_1$-$I_4$, the testing circuit 240 can be viewed as an aging simulation circuit since the input signals $I_1$-$I_4$ have different frequencies respectively, and since the selection circuit 224 may selectively output an input signal, selected from the input signals $I_1$-$I_4$, having a specific frequency as the testing signal TS. In some embodiments, the testing signal TS may be viewed as an aging signal.

In some embodiments, the testing signal TS selected from the input signals $I_1$-$I_4$ has the specific frequency which is the closest to an operating frequency of a detected target circuit surrounding the aging detection circuit 200. Accordingly, the aging detection circuit 200 may simulate an aging level of the detected target circuit surrounding the aging detection circuit 200 more precisely. For example, as shown in FIG. 1, the input signal, which has a frequency the closest to the said operating frequency, for the aging detection circuit 122 is selected from the input signals $I_1$-$I_4$ as the aging signal according to an operating frequency of the internal circuit part 131 having representativeness and surrounding the aging detection circuit 122.

When the selection circuit 224 feeds back the output signal RO of the testing circuit 240 to the testing circuit 240, the testing circuit 240 may be viewed as an oscillation circuit, and the generated output signal RO may be an oscillation signal, in which a frequency of the oscillation signal is a metric of performance. For example, when the testing circuit 240 continuously receives the aging signal having the specific frequency for a operating time length, the characteristic of the transistors inside the testing circuit 240 is changed, which lowers the frequency of the oscillation signal corresponding to the testing circuit 240. In more details, aging of the testing circuit 240 shifts up the threshold voltages of the transistors in the testing circuit 240 such that the testing circuit 240 is unable to operate in an oscillation frequency corresponding to a non-aging circumstance. Therefore, the aging detection circuit 200 has both the functions of aging simulation and of performance detection.

Referring back to FIG. 1, the chip monitoring circuit 160 monitors operating environment of the internal circuit 130.

For example, the chip monitoring circuit 160 monitors operating frequency, operating temperature, power status and etc. of the internal circuit 130. The chip monitoring circuit 160 may further records the operating environment in the memory 140. Especially when internal circuit 130 first operates, the chip monitoring circuit 160 sets the selection circuits 222 of the aging detection circuits 121-129 so as to feed back the output signals RO to the input terminals of the testing circuits 240 respectively, which makes the testing circuits 240 of the aging detection circuit 121-129 generate the oscillation signals. Consequently, the chip monitoring circuit 160 calculates frequencies of the oscillation signals and records the frequencies to the memory 140.

Figure 3:
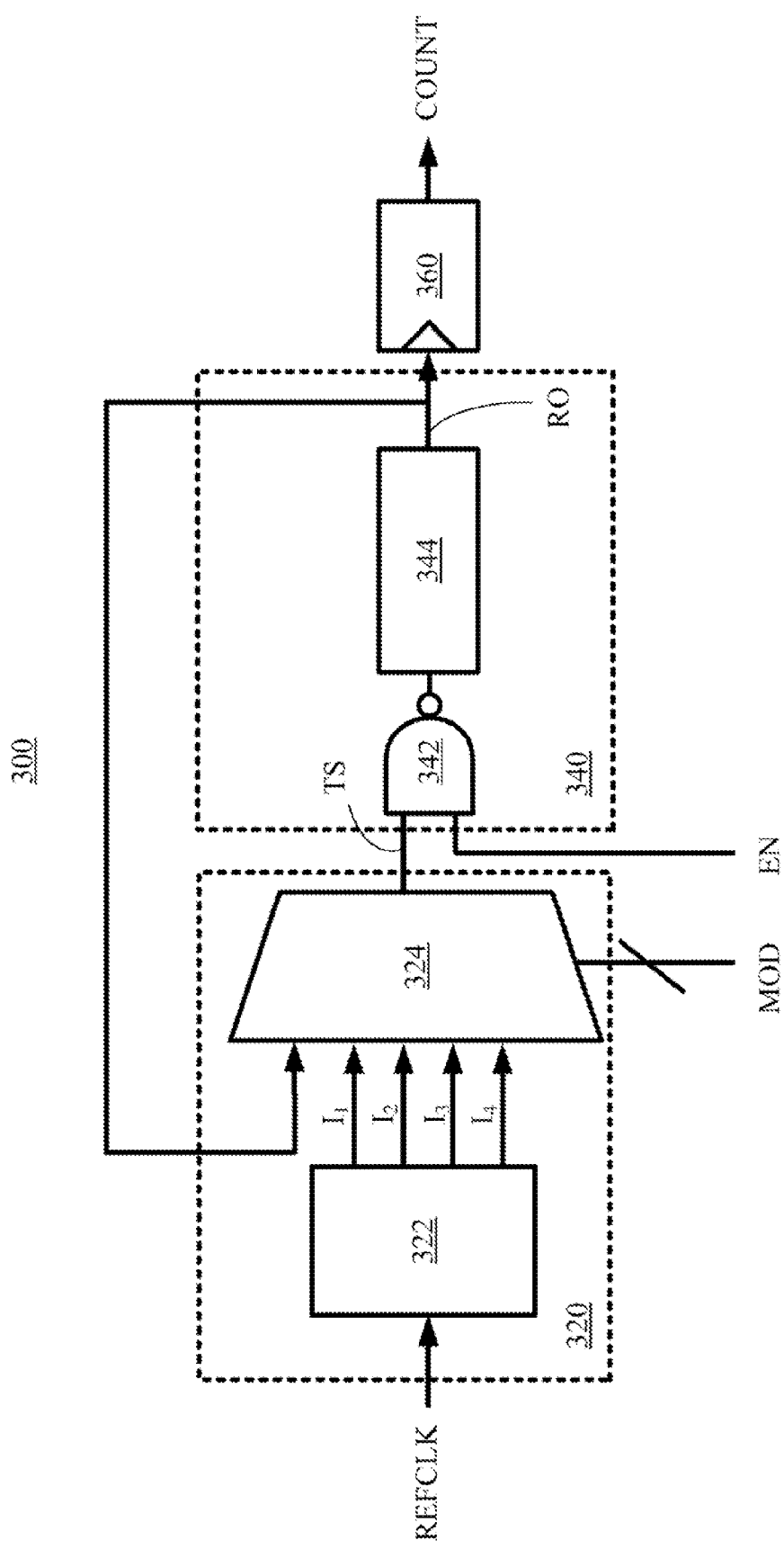
FIG. 3 is a circuit diagram illustrating an aging detection circuit according to one embodiment of this disclosure.

Reference is also made to FIG. 3 in order to illustrate the implementation of the aging detection circuit 200. FIG. 3 is a circuit diagram illustrating an aging detection circuit 300 according to one embodiment of this disclosure. The aging detection circuit 300 includes an aging signal generation circuit 320, a testing circuit 340 and a counter 360. The aging signal generation circuit 320 includes a signal generation circuit 322 and a selection circuit 324. The testing circuit 340 includes a NAND logic gate 342 and a delay circuit. The aging signal generation circuit 320 is electrically connected to the testing circuit 340. The testing circuit 340 is electrically connected to the counter 360.

The signal generation circuit 322 receives a reference clock signal REFCLK and generates the input signals $I_1$-$I_4$ having different frequencies to the selection circuit according to a frequency of the reference clock signal REFCLK.

Figure 4:
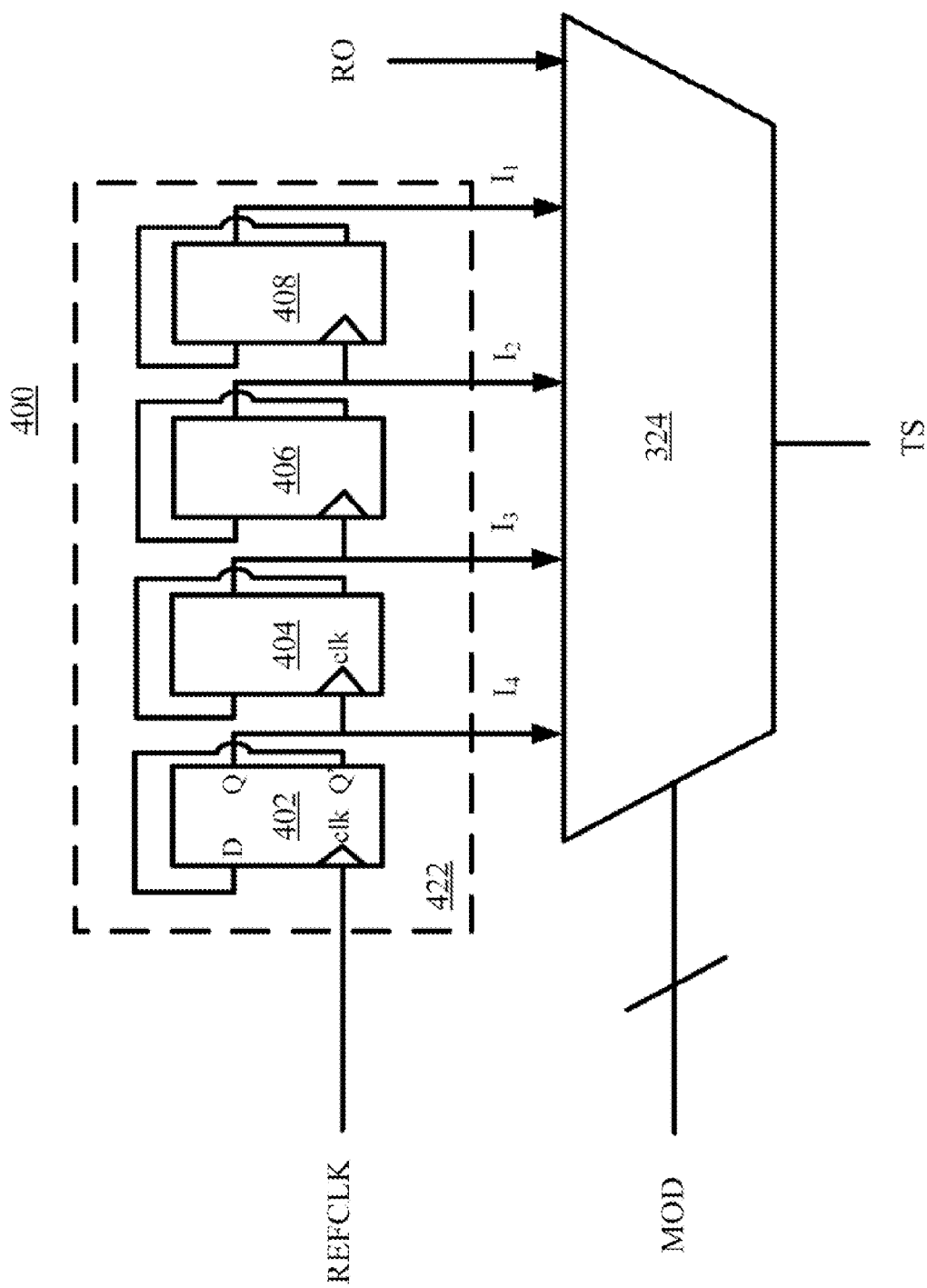
FIG. 4 is a circuit diagram illustrating aging signal generation circuit according to one embodiment of this disclosure.

In some embodiments, the signal generation circuit 322 is a frequency divider 422 shown in FIG. 4. FIG. 4 is a circuit diagram illustrating aging signal generation circuit 400 according to one embodiment of this disclosure. The frequency divider 422 includes D-type flip-flops 402, 404, 406 and 408. The D-type flip-flop 402 has an input terminal clk, an input terminal D, an output terminal Q and an output terminal Q', in which the output terminal Q' outputs a signal which is the inverse of a signal outputted by the output terminal Q. For example, if the output terminal Q has a high voltage level, the output terminal Q' has a low voltage level. The output terminal Q' of the D-type flip-flop is electrically connected to the input terminal D. The output terminal Q is electrically connected to the selection circuit 324 and generates the input signal $I_4$. The D-type flip-flops 404, 406 and 408 have the same input terminals, output terminals and the mentioned connecting relationship as the D-type flip-flop 402 has. Moreover, the input terminal CLK of the D-type flip-flop 402 receives a reference clock signal REFCLK, and the output terminal Q is electrically connected to the input terminal clk of the next D-type flip-flop 404, and the connecting relationships between the D-type flip-flops 404 and 406 and between the D-type flip-flops 406 and 408 are the same as the connecting relationship between the D-type flip-flops 402 and 404. Therefore, D-type flip-flops 404, 406 and 408 respectively generate the input signals $I_3$, $I_2$ and $I_1$ having the progressively decreasing frequencies. That is to say, the frequency of the input signal $I_3$ is the half of the frequency of the input signal $I_4$, and so forth as the input signals $I_2$ and $I_1$ have the half of the frequencies of the input signal $I_3$ and $I_2$ respectively.

In some embodiments, the signal generation circuit 322 may be a frequency converter or a frequency demultiplier.

The selection circuit 324 further receives the output voltage RO of the testing circuit 340, and the selection circuit 324 outputs one of the input signals $I_1$-$I_4$ or the output signal RO which is fed back by the testing circuit 340 as the testing signal TS according to a selection signal MOD.

Referring back to FIG. 3, two terminals of the NAND logic gate 342 receive the testing signal TS outputted by the selection circuit 324 and an enable signal EN respectively. In the circumstance that the power is supplied normally, the output of the NAND gate 342 keeps at a high voltage level when the enable signal is at a low voltage level, which makes the testing circuit 340 unable to oscillate and to receive any one of the input signals $I_1$-$I_4$. The function of the testing circuit 340 operates normally when the enable signal EN is at a high voltage level.

When the selection circuit 324 outputs the output signal RO of the testing circuit 340 back to the testing circuit 340, the delay circuit 344 associated with the NAND logic gate 342 become a ring oscillator. The output signal RO of the delay circuit 344 may be viewed as the oscillation signal. The counter 360 counts a number of clock cycles COUNT corresponding to the output signal RO in a time period and transmits the number of clock cycles COUNT to the chip monitoring circuit 160 shown in FIG. 1 such that the chip monitoring circuit 160 can calculate the oscillation frequency of the output signal RO.

In some embodiments, the delay circuit 344 includes n inverters connected in parallel, in which n is an even number.

In some embodiments, the NAND logic gate 342 can be replaced with an inverter, in which the inverter only receives the testing signal TS of the selection circuit 324.

Figure 5:
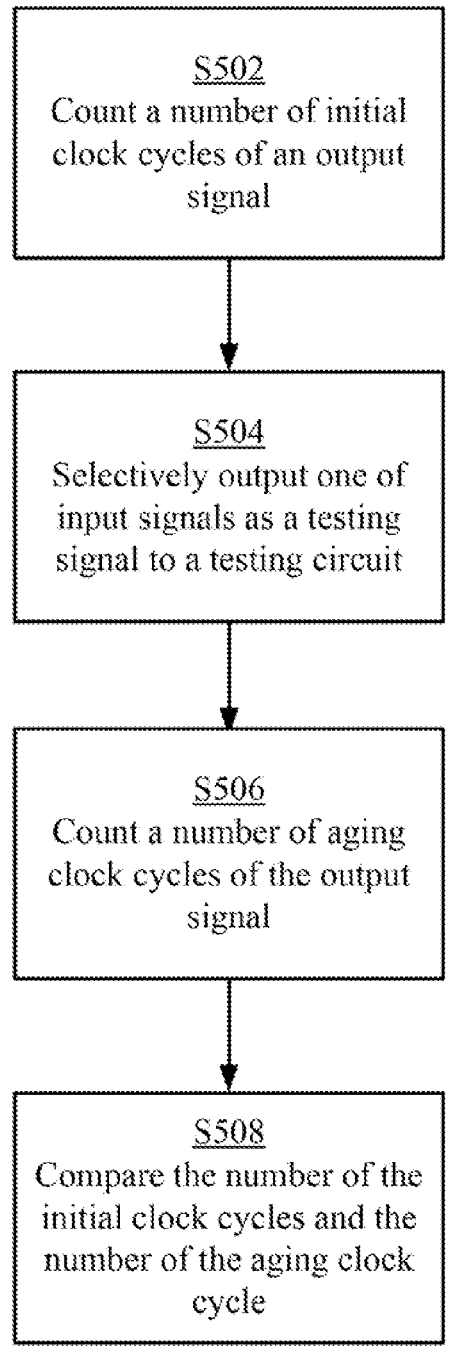
FIG. 5 is a flow diagram illustrating an aging detection method according to one embodiment of this disclosure.

Moreover, in order to illustrate the complete flow of an aging detection method, reference is made to FIG. 3 and FIG. 5. FIG. 5 is a flow diagram illustrating an aging detection method, which is suitable for the aging detection circuit 300 detecting aging levels of the surrounding circuits, according to one embodiment of this disclosure.

First of all, when the testing circuit 340 of the aging detection circuit 300 first operates, the output terminal RO generated by the testing circuit 340 is fed back to the input terminal of the testing circuit 340, and the number of initial clock cycles corresponding to the output signal Ro is counted (step S502). Consequently, the signal generating circuit 322 generates the input signals $I_1$-$I_4$ having different frequencies, and the selection circuit 324 selectively outputs one of the input signals $I_1$-$I_4$ as the testing signal TS to the testing circuit 340 (step S504). After a period of time, the selection circuit 324 feeds back the output signal RO generated by the testing circuit 340 to the input terminal of the testing circuit 340, and the number of the aging clock cycles corresponding to the output signal RO is counted (step S506). At last, the number of the initial clock cycles and the number of the aging clock cycles are compared in order to obtain the aging level of the surrounding circuit (step S508). Accordingly, the operating voltage level of the surrounding circuit can be adjusted according to the aging level.

In some embodiments, the chip control circuit 160 shown in FIG. 1 may record the number of the initial clock cycles or the calculation result based on the number of the initial clock cycles to the memory 140 shown in FIG. 1.

In all the embodiments mentioned above, the memory 140 may be a one-time programmable memory, a read-only memory, a flash memory or other non-volatile memory having a function of storage.

In the related embodiments mentioned above, the selection circuits 224 and 324 may be a multiplexer respectively.

According to the embodiments mentioned above, the aging detection circuit of the present disclosure can detect the aging level of the chip without any externally connected hardware resource. In addition, aging signals received by the testing circuit have different frequency such that the aging level of the testing circuit is closer to the practical aging level, which makes the aging level be detected more efficiently.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An aging detection circuit, configured on a chip, comprising:
    a testing circuit, configured to generate an output signal;
    an aging signal generation circuit, electrically coupled to the testing circuit, comprising:
        a signal generation circuit, configured to generate a plurality of input signals having different frequencies; and
        a selection circuit, configured to selectively output one of the input signals as an aging signal to an input terminal of the testing circuit, or to feed back the output signal generated by the testing circuit to the input terminal of the testing circuit,
    wherein when the output signal generated by the testing circuit is fed back to the input terminal of the testing circuit, the testing circuit has a function of an oscillator to make the output signal as an oscillation signal.

2. The aging detection circuit of claim 1, wherein the selection circuit comprises:
    a plurality of input terminals, configured to receive the input signals and the output signal generated by the testing circuit;
    a selection terminal, configured to receive a selection signal; and
    an output terminal, configured to output one of the input signals as the aging signal according to the selection signal, or to output the output signal generated by the testing circuit to the input terminal of the testing circuit.

3. The aging detection circuit of claim 1, wherein the aging detection circuit further comprises a counter configured to receive the oscillation signal and to count a number of clock cycles corresponding to the oscillation signal in a time period.

4. The aging detection circuit of claim 1, wherein the signal generation circuit is further configured to receive a reference clock signal and to generate the input signals according to the reference clock signal.

5. The aging detection circuit of claim 4, wherein the signal generation circuit is a frequency divider, a frequency demultiplier or a frequency converter.

6. An aging detection method, suitable for a testing circuit detecting an aging level of a surrounding circuit, comprising:
    feeding back a first output signal generated by the testing circuit to the testing circuit from a first time point;
    generating a plurality of input signals having different frequencies and selectively outputting one of the input signals as an aging signal to an input terminal of the testing circuit from a second time point which is later than the first time point;

feeding back a second output signal generated by the testing circuit to the testing circuit from a third time point which is later than the second time point; and comparing the first output signal and the second output signal.

7. The aging detection method of claim 6, further comprising:

counting a first number of clock cycles corresponding to the first output signal in a time period; and counting a second number of clock cycles corresponding to the second output signal in the time period.

8. The aging detection method of claim 7, wherein the step of comparing the first output signal and the second output signal comprises comparing the first number of clock cycles of the first output signal and the second number of clock cycles of the second output signal.

9. The aging detection method of claim 6, wherein the step of generating the input signals comprises:

generating the input signals according to a reference clock signal, wherein the frequencies of the input signals are different times of the frequency corresponding to the reference clock signal.

\* \* \* \* \*